United States Patent
Asai et al.

(10) Patent No.: US 10,910,324 B2
(45) Date of Patent: Feb. 2, 2021

(54) SEMICONDUCTOR DEVICE HAVING A RESIN CASE WITH A NOTCH GROOVE

(71) Applicant: FUJI ELECTRIC CO., LTD., Kawasaki (JP)

(72) Inventors: Tatsuhiko Asai, Hino (JP); Katsumi Taniguchi, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 149 days.

(21) Appl. No.: 15/445,313

(22) Filed: Feb. 28, 2017

(65) Prior Publication Data
US 2017/0271273 A1    Sep. 21, 2017

(30) Foreign Application Priority Data
Mar. 18, 2016 (JP) ................. 2016-056246

(51) Int. Cl.
| | | |
|---|---|---|
| H01L 23/04 | (2006.01) | |
| H01L 23/00 | (2006.01) | |
| H01L 21/48 | (2006.01) | |
| H01L 21/52 | (2006.01) | |
| H01L 23/049 | (2006.01) | |
| H01L 23/10 | (2006.01) | |

(52) U.S. Cl.
CPC ........ *H01L 23/562* (2013.01); *H01L 21/4817* (2013.01); *H01L 21/52* (2013.01); *H01L 23/049* (2013.01); *H01L 23/10* (2013.01); *H01L 24/48* (2013.01); *H01L 2224/48225* (2013.01); *H01L 2924/1203* (2013.01); *H01L 2924/13055* (2013.01)

(58) Field of Classification Search
CPC ... H01L 23/562; H01L 21/4817; H01L 21/52; H01L 23/10; H01L 23/04
See application file for complete search history.

(56) References Cited

U.S. PATENT DOCUMENTS 6,031,278 A * 2/2000 Onoda ................ H01L 23/5388
257/679
2006/0061971 A1   3/2006 Inoue
2008/0030642 A1 * 2/2008 Harayama ......... G02F 1/133308
349/58

(Continued)

FOREIGN PATENT DOCUMENTS

| JP | 2006093232 A | 4/2006 |
| JP | 2013-16684 A | 1/2013 |

OTHER PUBLICATIONS

F.D.K. Ching and C. Adams, Building Construction Illustrated, 2000, Wiley, 3rd Ed, p. 7.46.*

(Continued)

*Primary Examiner* — Wael M Fahmy
*Assistant Examiner* — Sarah K Salerno
(74) *Attorney, Agent, or Firm* — Rabin & Berdo, P.C.

(57) ABSTRACT

A semiconductor device has a configuration in which a stacked assembly and a resin case are combined. The stacked assembly includes a semiconductor element, a stacked substrate on which the semiconductor element is mounted, and a metal substrate on which the stacked substrate is mounted. In the resin case, a notch groove is provided at a corner portion for reducing a stress. At least one of a width and a length of the notch groove is 2 mm or more.

12 Claims, 4 Drawing Sheets

(56) References Cited

U.S. PATENT DOCUMENTS

| | | | |
|---|---|---|---|
| 2014/0167241 A1* | 6/2014 | Matsuoka | H01L 23/24 257/690 |
| 2016/0104631 A1* | 4/2016 | Guth | H01L 21/4817 361/728 |
| 2016/0276234 A1* | 9/2016 | Sugiyama | H01L 23/053 |
| 2017/0053845 A1* | 2/2017 | Interrante | H01L 23/373 |
| 2017/0221790 A1* | 8/2017 | Tomie | H01L 23/367 |
| 2017/0278770 A1* | 9/2017 | Kato | H01L 25/07 |

OTHER PUBLICATIONS

D.R. Askeland, The Science and Engineering of Materials, 1989, 2nd Ed, p. 760.*

* cited by examiner

|  | WIDTH Wmm | W/T% | LENGTH Lmm | L/T% | EFFECT VALUE % |
|---|---|---|---|---|---|
| EXAMPLE 1 | 2 | 4 | 2 | 4 | 90 |
| EXAMPLE 2 | 4 | 8 | 2 | 4 | 78 |
| EXAMPLE 3 | 10 | 20 | 2 | 4 | 70 |
| EXAMPLE 4 | 2 | 4 | 4 | 8 | 85 |
| EXAMPLE 5 | 4 | 8 | 4 | 8 | 59 |
| EXAMPLE 6 | 10 | 20 | 4 | 8 | 50 |
| EXAMPLE 7 | 2 | 4 | 10 | 20 | 75 |
| EXAMPLE 8 | 4 | 8 | 10 | 20 | 55 |
| EXAMPLE 9 | 10 | 20 | 10 | 20 | 45 |
| COMPARISON EXAMPLE | 0 | 0 | 0 | 0 | 100 |

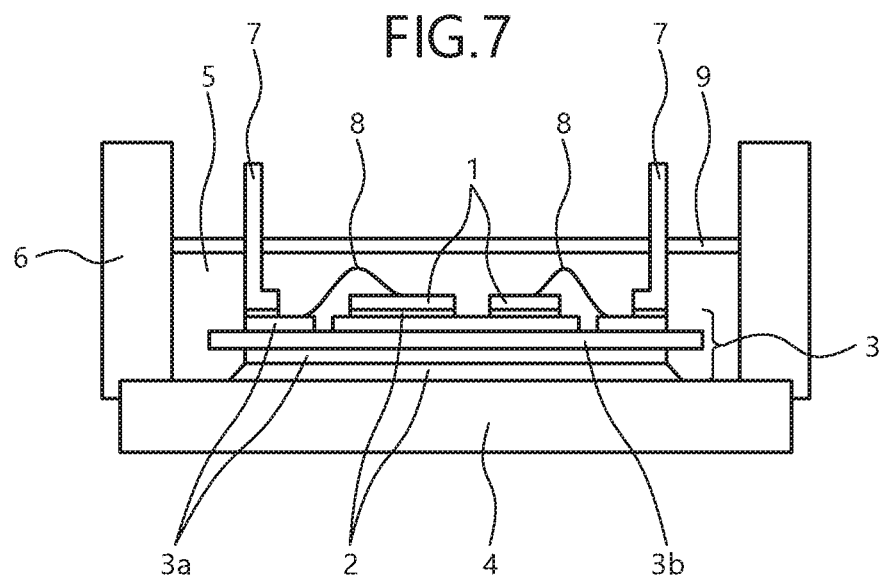
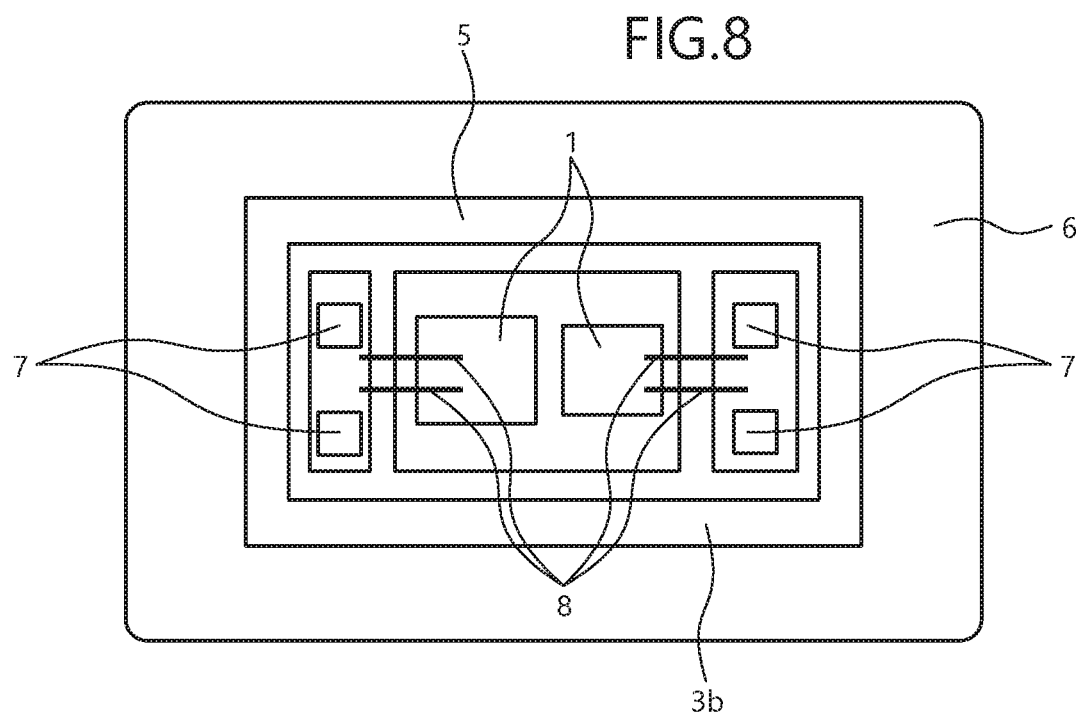

SEMICONDUCTOR DEVICE HAVING A RESIN CASE WITH A NOTCH GROOVE

CROSS REFERENCE TO RELATED APPLICATIONS

This application is based upon and claims the benefit of priority of the prior Japanese Patent Application No. 2016-056246, filed on Mar. 18, 2016, the entire contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, when silicon (Si) is used in semiconductor elements such as insulated gate bipolar transistors (IGBTs) implemented in power semiconductor modules, the maximum practical rated voltage is about 6.5 kV and silicone gel is used as a sealant resin for insulating and protecting semiconductor element.

On the other hand, development is advancing with respect to wide bandgap semiconductor elements that use a semiconductor material having a wider bandgap than that of silicon such as silicon carbide (SiC). Such semiconductor elements enable higher breakdown voltages to be achieved. Therefore, a method has been proposed in which a hard resin such as an epoxy resin that tolerates higher temperatures and voltages than silicone gel is used as a sealant resin (for example, refer to Japanese Laid-Open Patent Publication No. 2013-16684).

A structure of a typical IGBT power semiconductor module will be described as an example of a conventional structure of a power semiconductor module.

FIG. 7 is a cross-sectional view of a conventional structure of a power semiconductor module. FIG. 8 is a top view of the conventional structure of the power semiconductor module. As depicted in FIGS. 7 and 8, the power semiconductor module includes a power semiconductor chip 1, a bonding material 2, a stacked substrate 3, a metal substrate 4, a sealant resin 5, a resin case 6, a terminal 7, a bonding wire 8, and a cover 9.

The stacked substrate 3 to which the power semiconductor chip 1 is bonded is mounted on the metal substrate 4 and the resin case 6 is adhered onto the metal substrate 4 by an adhesive. In the resin case 6, arrangement of the stacked substrate 3 maintains a certain distance between the stacked substrate 3 and the resin case 6 and by filling the resin case 6 with the sealant resin 5, insulation between the stacked substrate 3 and the resin case 6 is ensured.

SUMMARY OF THE INVENTION

According to one aspect of the present invention, a semiconductor device includes a stacked assembly including a semiconductor element, a stacked substrate on which the semiconductor element is mounted, and a metal substrate on which the stacked substrate is mounted; and a resin case combined with the stacked assembly. The resin case includes a notch groove provided at a corner portion.

In the semiconductor device, at least one of a width and a length of the notch groove is 4% or more of an internal dimension of a longitudinal side of the resin case.

In the semiconductor device, at least one of a width and a length of the notch groove is 2 mm or more.

In the semiconductor device, an angle formed by an internal aspect of the notch groove and an internal aspect of the resin case is 90 degrees to 150 degrees.

According to another aspect of the present invention, a method of manufacturing a semiconductor device includes assembling a stacked assembly by mounting a semiconductor element on a stacked substrate, and mounting the stacked substrate on a metal substrate; and combining the stacked assembly with a resin case in which a notch groove is provided at corner portions of the resin case.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a cross-sectional view of a conventional structure of a power semiconductor module; and FIG. 8 is a top view of the conventional structure of the power semiconductor module.

DETAILED DESCRIPTION OF THE INVENTION

Figure 1:
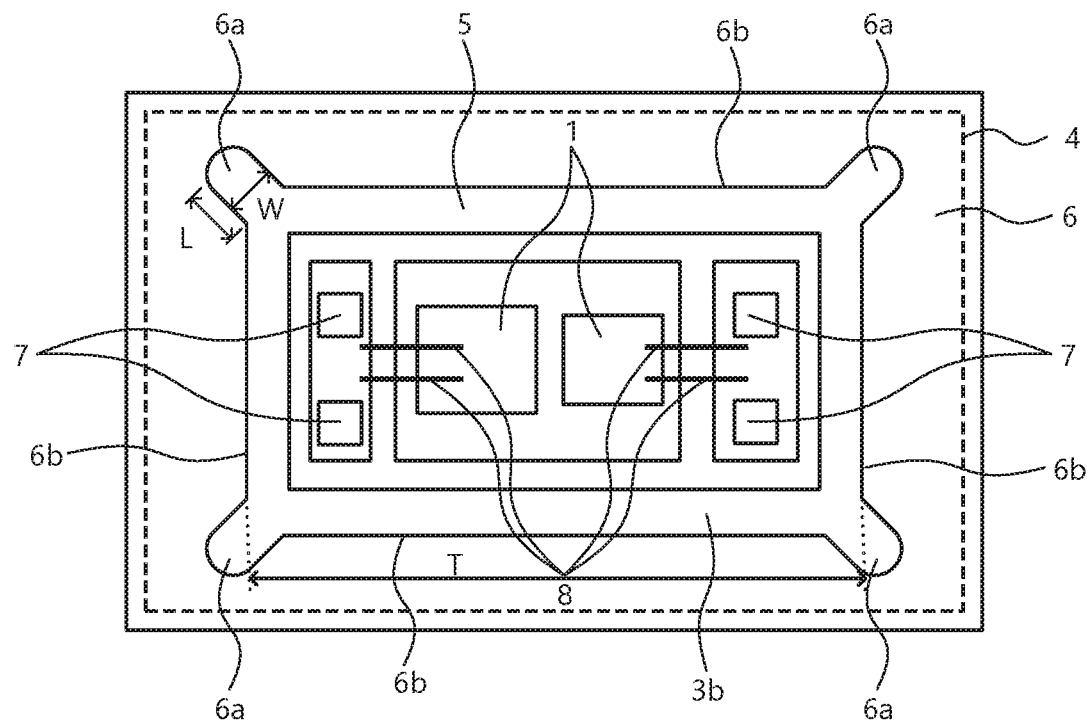
FIG. 1 is a top view of a configuration of a power semiconductor module according to an embodiment.

Embodiments of a semiconductor device and a method of manufacturing a semiconductor device according to the present invention will be described in detail with reference to the accompanying drawings. FIG. 1 is a top view of a configuration of a power semiconductor module according to an embodiment. A cross-sectional view thereof is similar to that depicted in the FIG. 7 and is therefore omitted.

As depicted in FIGS. 1 and 7, the power semiconductor module includes the power semiconductor chip 1, the bonding material 2, the stacked substrate 3, the metal substrate 4, the sealant resin 5, the resin case 6, the terminal 7, the bonding wire 8, and the cover 9.

The power semiconductor chip 1 is an IGBT or diode, etc. power semiconductor chip and is bonded by the bonding material 2 such as solder and mounted on the stacked substrate 3. The stacked substrate 3 includes on a front surface, an insulating substrate 3b that is a ceramic substrate or the like and includes on a rear surface, a conducting plate 3a of copper or the like. The stacked substrate 3 is bonded and mounted to the metal substrate 4 by the bonding material 2 such as solder. In FIG. 1, a dashed line indicates a position of the metal substrate 4.

The resin case 6 is combined with a stacked assembly in which the power semiconductor chip 1, the stacked substrate 3, and the metal substrate 4 are stacked. For example, the resin case 6 is adhered to the stacked assembly by an adhesive such as silicon. The resin case 6 has an inner space with an approximately rectangular shape in a plan view. The inner space has a long side whose length is T and a short side. The stacked substrate 3 is disposed within the inner space. In the resin case 6, arrangement of the stacked substrate 3 maintains a certain distance between the stacked substrate 3 and the resin case 6. Further, the inner space of the resin case 6 is filled with the sealant resin 5 of a hard resin such as an epoxy resin or a silicone gel having a low modulus of elasticity to insulate and protect the power semiconductor chip 1 on the stacked substrate 3, forming a package with the cover 9. When a hard resin such as an epoxy resin is used as the sealant resin 5, the cover 9 may be omitted.

The terminal 7 is bonded by the bonding material 2 and fixed to the conducting plate 3a to penetrate the cover 9 and protrude to the exterior. The bonding wire 8 electrically connects the power semiconductor chip 1 and the conducting plate 3a.

In the power semiconductor module of the embodiment, a notch groove 6a extending in an outward direction of the resin case 6 is provided at each inner corner portion of an internal surface of the resin case 6 for reducing a stress at the inner corner portion. The inner corner portion of an internal surface of the resin case 6 is a corner of an internal surface of the resin case 6, i.e., a portion where internal sides intersect. Further, the inner corner portion of an internal surface of the resin case 6 may be indicated simply as "corner portion" hereinafter. The notch groove 6a joins the corner portion of the resin case 6 at a junction and opens into the inner space, and has a curved portion opposite to the junction. The notch groove 6a may extend in a depth direction perpendicular to a surface of the metal substrate 4. For example, the notch groove 6a penetrates from a bottom portion of the resin case 6 adhered to the metal substrate 4 to a top portion of the resin case 6, which is in an opposite direction from the metal substrate 4. An internal surface of the resin case 6 is an aspect in contact with sealant resin. For example, an internal surface of the resin case 6 is an aspect indicated by reference numeral 6b in FIG. 1.

The notch groove 6a has a width W and a length L that may each be preferably 4% or more of an internal dimension of a longitudinal side T of the resin case 6 and more preferably, each may be 8% or more. The width W can be a width of the notch groove 6a at the junction, and the length L can be a length from the junction to the curved portion of the notch groove 6a. The width W of the junction may be perpendicular to the length L from the junction to the curved portion, in the plan view. The reason for this is described in detail with the following examples. The width of the notch groove 6a is a distance between internal surfaces of the resin case 6 in the notch groove 6a. The length of the notch groove 6a indicates a length in a depth direction toward an external surface of the resin case. In particular, the internal dimension of the longitudinal side T of the resin case 6 is about 50 mm; and the width W and the length L of the notch groove 6a are each preferably 4 mm or more. Stress acting on the corner portions is affected by the internal dimension of the longitudinal side T of the resin case 6 and the ratio of the width and depth of the notch groove 6a. The internal dimension of the longitudinal side T of the resin case 6 is that of the longer side among the internal dimensions of the internal sides of the resin case 6.

Figure 2A:
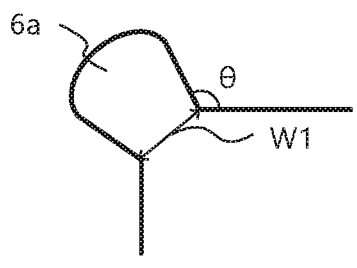
FIGS. 2A and 2B are top views of other shapes of a notch groove of the power semiconductor module according to the embodiment.
Figure 2B:
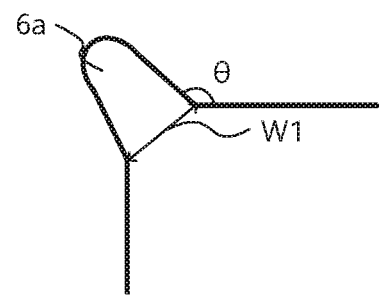

In FIG. 1, although an inner portion of the notch groove 6a is formed having an arc shape, an arc shape is not particularly necessary and the shape of the inner portion may be linear, for example. Further, the shape of the notch groove 6a is not limited to the shape depicted in FIG. 1. FIGS. 2A and 2B are top views of other shapes of the notch groove of the power semiconductor module according to the present embodiment. FIGS. 1, 2A, and 2B also show plan views of the semiconductor device. As depicted in FIG. 2A, the notch groove 6a may be shaped to widen in the direction of depth (from the junction to the curved portion). Conversely, as depicted in FIG. 2B, the notch groove 6a may be shaped to narrow in the direction of depth. Therefore, an angle θ formed by an internal aspect of the resin case 6 and an internal aspect of the notch groove 6a may be configured to be 90 to 150 degrees. Specifically, the angle θ may be defined as an angle between a side defining the inner space of the resin case 6 and a side of the notch groove 6a in a region of the junction, and the angle θ may be in the range of 90 degrees to 150 degrees, in the plan view, as shown in FIGS. 2A and 2B. FIG. 1 depicts a case in which the angle θ is 135 degrees. FIG. 2A depicts a case in which the angle θ is less than 135 degrees and FIG. 2B depicts a case in which the θ is greater than 135 degrees. Further, the notch grooves 6a need not be linearly symmetrical and all the notch grooves 6a in the resin case 6 need not be of the same shape. The width of the notch groove 6a in this case is a mouth of the notch groove 6a, i.e., an extent of a portion where an internal side of the resin case 6 and the notch groove 6a intersect. For example, in FIGS. 2A and 2B, the width of the notch groove 6a is an extent indicated by W1.

In the present embodiment, the notch groove 6a provided at the corner portions of the internal surfaces of the resin case 6 is able to mitigate stress that concentrates at the corner portions by dispersing the stress to an internal surface of the notch groove 6a. Therefore, even if stress concentrates at the corner portions of the resin case 6 consequent to the difference of the coefficients of thermal expansion of the resin case 6 and the metal substrate 4, the notch groove 6a is able to mitigate the stress. That is, the notch groove 6a at each inner corner portion of the resin case 6 is provided for reducing the stress caused by the difference between coefficients of thermal expansion of materials of two or more of the resin case 6, the sealant resin 5 and the metal substrate 4.

A method of manufacturing such a power semiconductor module is similar to that for a power semiconductor module by a conventional technique. In a manufacturing method of a power semiconductor module, first, the power semiconductor chip 1 is mounted on the stacked substrate 3 and, the bonding wire 8 and the terminal 7 are attached. In place of the bonding wire 8, a metal terminal may be bonded. Next, these are bonded to the metal substrate 4 whereby the power semiconductor chip 1, the stacked substrate 3, and the metal substrate 4 are assembled into a stacked assembly. The resin case 6 in which the notch grooves 6a are provided is adhered to the corner portions of the stacked assembly by an adhesive such as silicon. Next, the resin case 6 is filled with the sealant resin 5 and the cover 9 is installed. Thus, the power semiconductor module according to the embodiment and depicted in FIG. 1 is completed. When the sealant resin 5 is a hard resin such as an epoxy resin, the sealant resin 5 does not leak to the exterior and therefore, the cover 9 may be omitted.

Figure 3:
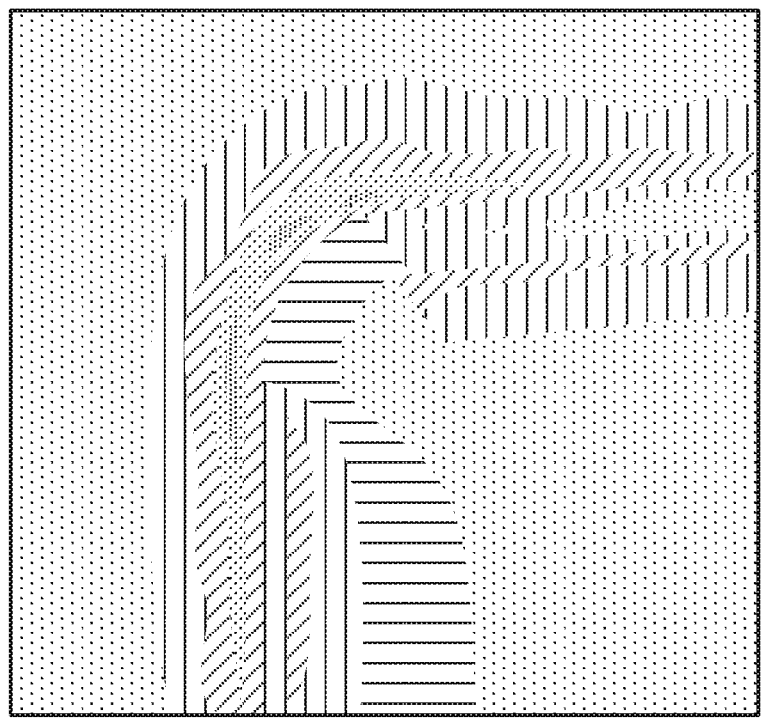
FIG. 3 is a diagram of stress distribution at a corner portion of a power semiconductor module according to an example.
Figure 4:
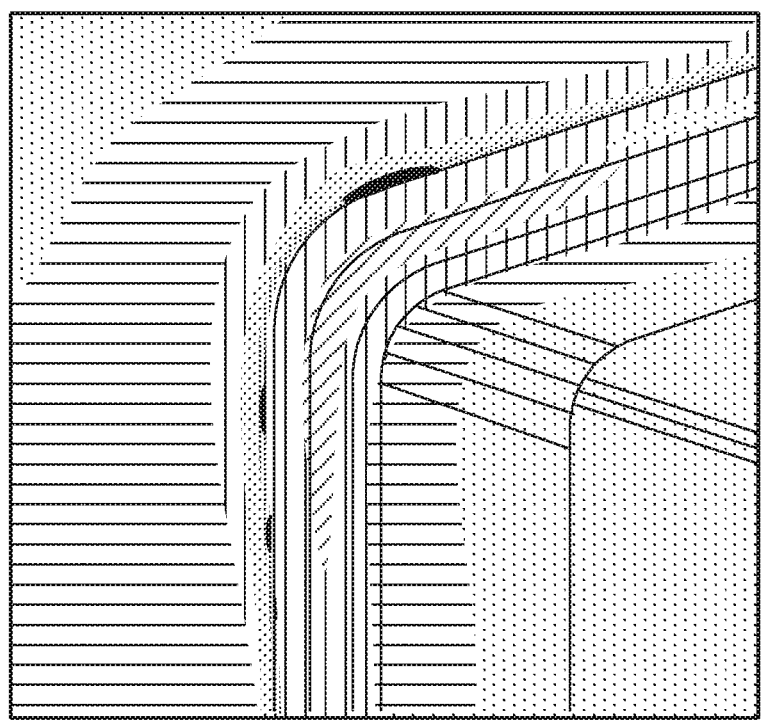
FIG. 4 is a diagram of stress distribution at a corner portion of a power semiconductor module of a conventional example.

Examples will be described. Here, an example in which the notch groove 6a is provided at corner portions of the internal surfaces of the resin case 6 and a conventional example in which a curved shape is provided at the corner portions of the internal surfaces of the resin case 6 are compared. FIG. 3 is a diagram of stress distribution at a corner portion of a power semiconductor module according to the example. FIG. 4 is a diagram of stress distribution at a corner portion of a power semiconductor module of the conventional example. The radius of curvature of the corner portion of the conventional example was 2 mm and the radius of curvature of the outer side of the notch portion of the example was also 2 mm FIGS. 3 and 4 depict stress distribution at 175 degrees C.

FIGS. 3 and 4 are perspective views as viewed from a lower right side near a corner portion of the resin case 6 and were obtained by calculation through simulation of stress occurring near the corner portions of the resin cases 6 when the power semiconductor modules were brought from room temperature to a high temperature, and from a high temperature to a low temperature.

FIGS. 3 and 4 are contour diagrams in which points of equal stress are connected by a line. Here, areas filled in with black have the highest stress and the stress is correspondingly lower the thinner the hatching is. In comparing FIG. 3 and FIG. 4, it is found that the area filled in with black at the corner portion in FIG. 4 is a region having thin hatching in FIG. 3 and thus, compared to the conventional example, the example is able to reduce the stress that concentrates the corner portions.

Figures 5, 6:
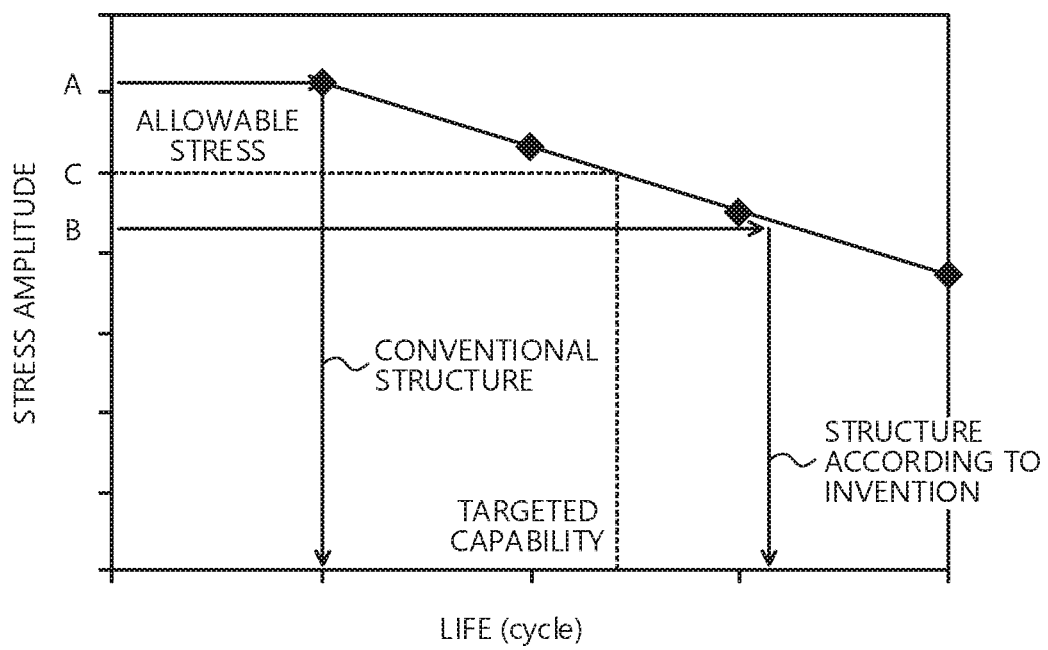
FIG. 5 is a graph of stress amplitude and package life of the power semiconductor module.
FIG. 6 is a chart depicting widths and lengths of the notch groove and stress reduction effects at corner portions.

Since the stress that concentrates at the corner portions may be reduced by the resin case 6 of the example, prevention of cracking of the resin case 6 even when temperature changes occur was confirmed. FIG. 5 is a graph of stress amplitude and package life of the power semiconductor module. The graph depicts results for thermal fatigue life in a case of repeated temperature cycling obtained from a fatigue life curve of the material of the resin case 6 of power semiconductor module.

In FIG. 5, the vertical axis represents in units of MPa, stress amplitudes consequent to temperature cycling. Here, the stress amplitude is the difference of the stress at a high temperature and the stress at a low temperature. The horizontal axis represents package life and is in units of cycles. Package life, for example, is the number of (cycles) of temperature changes between high and low temperatures before cracks in the package occur. From FIG. 5, it is found that the larger the stress amplitude is, the shorter the package life is.

In FIG. 5, the targeted capability is the life required of the package of the power semiconductor module. According to FIG. 5, when the stress amplitude is greater than a value indicated by C, the targeted capability cannot be achieved and when the stress amplitude is a value less than the value indicated by C, the targeted capability can be achieved.

In the case of the conventional example, the stress amplitude corresponding to the highest calculated stress of the corner portions in FIG. 4 is indicated by A in FIG. 5. The value indicated by A is greater than the value indicated by C and therefore, the life corresponding to A is a value that is lower than the targeted capability. Therefore, in the conventional example, the targeted life cannot be achieved. In actual temperature cycling testing, it was confirmed that stress concentrated at the corner portions of the conventional example and after a few cycles, cracks occurred in the resin case.

On the other hand, in the case of the example, the stress amplitude corresponding to the highest calculated stress of the corner portions in FIG. 3 is indicated by B in FIG. 5. The value indicated by B is smaller than the value indicated by C and therefore, the life corresponding to B is a value higher than the targeted capability. Therefore, in the example, the targeted life can be achieved.

A desirable width and length for the width W and the length L of the notch groove 6a was verified by simulation. FIG. 6 is a chart depicting widths and lengths of the notch groove and stress reduction effects at the corner portions. The maximum stress applied to the corner portions occurs at high temperatures and therefore, the simulation evaluated the maximum stress (MPa) (tension) at a high temperature (175 degrees C.). In FIG. 6, T is the internal dimension of the longitudinal side T of the resin case 6; in the simulation, T was 50 mm. The width W is the width W of the notch groove 6a and the unit thereof is mm. W/T is a ratio of the width W of the notch groove 6a to the internal dimension of the longitudinal side T of the resin case 6, and the unit thereof is a percentage. The length L is the length L of the notch groove 6a, and the unit thereof is mm. L/T is the ratio of the length L of the notch groove 6a to the internal dimension of the longitudinal side T of the resin case 6, and the unit thereof is a percentage. An effect value indicates a reduction rate of the stress at the corner portions with respect to a comparison example in which the notch groove 6a is not formed. In other words, in examples 1 to 9 the width W and the length L were varied and the maximum stress at 175 degrees C. was compared to the maximum stress is assumed to be 100 in the comparison example at 175 degrees C. Therefore, the smaller the effect value is the higher the effect of reducing the stress at the corner portions is.

According to examples 1, 2, and 3 in FIG. 6, it is found that accompanying the increased widths W, i.e., accompanying the increased values of W/T, the effect value decreases and thus, the effect of reducing the stress at the corner portions increases. The same is found concerning examples 4, 5, and 6 and concerning examples 7, 8, and 9. According to examples 1, 4, and 7 in FIG. 6, accompanying the increased lengths L, i.e., accompanying the increased values of L/T, the effect value decreases and thus, the effect of reducing the stress at the corner portions increases. The same is found concerning examples 2, 5, and 8 and concerning examples 3, 6, and 9.

To achieve the targeted capability in the package of the power semiconductor module, it is desirable to reduce the stress amplitude of the conventional structure by 10%. The stress amplitude is the difference of stress at a high temperature and stress at a low temperature; and assuming that the stress at a low temperature is also reduced by the same rate as the stress at a high temperature, to achieve the targeted capability of the package life, it is desirable to reduce the stress at the corner portions of the conventional example by at least 10%. In example 1 in FIG. 6, the effect value is 90% and thus, the stress at the corner portions may be reduced by 10%. Therefore, it is found that when W/T and L/T are each 4% or more, i.e., when the internal dimension of the longitudinal side T of the resin case 6 is 50 mm, the width W and the length L of the notch groove 6a each have to be 2 mm or more.

Further, during actual use of the power semiconductor module, with consideration of a margin for the temperature, utilization cycles, etc., it is desirable to reduce the stress at the corner portions of the conventional example by 40%. In example 5 in FIG. 6, the effect value is 59% and thus, the stress at the corner portions may be reduced by 41%. Therefore, when W/T and L/T are each 8% or more, i.e., when the internal dimension of the longitudinal side T of the resin case 6 is 50 mm, the width W and the length L of the notch groove 6a is desirably 4 mm or more. The internal dimension of the longitudinal side T of the resin case 6 is not limited to 50 mm Even when the longitudinal side T is not 50 mm, the effect of reducing stress may be similarly obtained. In particular, the longitudinal side T may be preferably of a range from 20 mm to 200 mm.

As described, according to the embodiment, provision of a notch groove at corner portions of the resin case enables mitigation of the stress concentrating at the corner portions of the resin case consequent to the differences of the coefficients of thermal expansion of the resin case and the metal substrate and of the resin case and the sealant resin. Therefore, the stress applied to the resin case may be reduced below the fracture strength of the resin case whereby cracks in the resin case may be prevented. As a result, since partial discharge at the corner portions is eliminated, it becomes possible to ensure insulation. Further, the invention enables conventional, general purpose resin materials to be used as is without the use of newly developed or stronger resin materials and thereby, enables the cost of the power semiconductor module to be suppressed.

Further, configuration of the angle formed by the internal aspect of the notch groove and the internal aspect of the resin case to be 90 to 150 degrees enables portions having acute angles in the resin case to be eliminated. As a result, the concentration of stress at portions having acute angles may be prevented, enabling the stress applied to the resin case to be reduced below the fracture strength of the resin case.

The present invention is not limited to the embodiments above and various modifications within a range not departing from the spirit of the invention are possible. For example, although the present invention has been described taking an example of a semiconductor device package in which a metal wire electrically connects the semiconductor chip and the wire terminal, and the case is filled with a thermosetting resin, the invention is further applicable to a package of a semiconductor device of a pin structure where conductor layers of a circuit substrate and a semiconductor chip arranged away from each other in the case are electrically connected by a terminal pin.

However, in the conventional power semiconductor module, when a temperature rise accompanying the heat generated by the operation of the semiconductor chip 1 or a temperature change in the usage environment occurs, thermal deformation occurs consequent to the difference of the coefficients of thermal expansion of the materials. In particular, since the resin case 6 is formed of resin, the coefficient of thermal expansion is large compared to the metal substrate 4. Therefore, at high temperatures, a convex thermal deformation occurs in the metal substrate 4. Further, at high temperatures, consequent to the difference of the coefficients of thermal expansion of the resin case 6 and the sealant resin 5, the sealant resin 5 filling the resin case 6 expands, applying pressure to the resin case 6. As a result, a problem arises in that stress concentrates near the corner portions in the resin case 6 and cracks occur in the resin case 6. When a crack occurs in the resin case 6, partial discharge occurs at the location of the crack, reducing the insulating capability.

As a structure to mitigate the stress near the corner portions in the resin case 6, the corner portion may be processed to have a curved shape. By increasing the size of this curved shape, the stress at the corner portions may be mitigated. However, because the size of the curved shape increases, the distance between the stacked substrate 3 and the resin case 6 decreases. As a result, the layer of the sealant resin 5 necessary for ensuring insulation of the power semiconductor module becomes thinner and since the discharge distance between the stacked substrate 3 and the resin case 6 decreases, the insulation capability decreases. On the contrary, when this distance is maintained, the size of the power semiconductor module itself increases whereby the cost increases.

According to the invention, provision of the notch groove at the corner portions in the resin case enables mitigation of the concentration of stress at the corner portions consequent to the differences of the coefficients of thermal expansion of the resin case and the metal substrate and of the resin case and the sealant resin. As a result, the stress applied to the resin case may be reduced below the fracture strength of the resin case whereby cracks in the resin case may be prevented. As a result, since partial discharge at the corner portions is eliminated, it becomes possible to ensure insulation. Further, the invention enables conventional, general purpose resin materials to be used as is without the use of newly developed or stronger resin materials and thereby, enables the cost of the power semiconductor module to be suppressed.

Further, configuration of the angle formed by the internal aspect of the notch groove and the internal aspect of the resin case to be 90 to 150 degrees enables portions having acute angles in the resin case to be eliminated. As a result, the concentration of stress at portions having acute angles may be prevented, enabling the stress applied to the resin case to be reduced below the fracture strength of the resin case.

The semiconductor device and the method of manufacturing a semiconductor device according to the present invention achieve an effect in that stress concentrating at the corner portions in the resin case consequent to the difference of the coefficients of thermal expansion is mitigated, enabling insulation of the stacked substrate and the resin case to be achieved.

As described, the semiconductor device and the method of manufacturing a semiconductor device according to the present invention are useful for, for example, semiconductor devices used in power converting equipment such as converters and inverters, and power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:
1. A semiconductor device, comprising:
   a stacked assembly including
      a semiconductor element,
      a stacked substrate on which the semiconductor element is mounted, and
      a metal substrate on which the stacked substrate is mounted; and
   a resin case combined with the stacked assembly,
   the resin case having an inner space therein,
   the stacked substrate being disposed within the inner space,
   the resin case having a notch groove at an inner corner portion thereof for reducing a stress at the inner corner portion,
   the notch groove extending in an outward direction of the resin case,
   the notch groove opening into the inner space,
   the notch groove penetrating through the resin case from a bottom thereof to a top thereof in a stacking direction of the stacked assembly, the notch groove being ended within the resin case in the outward direction, which is perpendicular to the stacking direction of the stacked assembly, and the inner space of the resin case being filled with a sealant resin.

2. The semiconductor device according to claim 1, wherein, the notch groove has a width and a length, each in a direction perpendicular to the stacking direction of the stacked substrate, and at least one of the width and the length of the notch groove is 4% or more of an internal dimension of a longitudinal side of the resin case.

3. The semiconductor device according to claim 1, wherein the inner space of the resin case has an approximately rectangular shape in a plan view, and having a long side and a short side, the stacked substrate being disposed within the inner space, the notch groove joins the inner corner portion of the resin case at a junction, opens into the inner space, and has a curved portion opposite to the junction, and at least one of a width of the notch groove at the junction and a length from the junction to the curved portion is 4% or more of a length of the long side of the inner space, in the plan view.

4. The semiconductor device according to claim 3, wherein the width of the notch groove at the junction is perpendicular to the length from the junction to the curved portion in the plan view.

5. The semiconductor device according to claim 1, wherein the notch groove has a width and a length, each in a direction perpendicular to the stacking direction of the stacked substrate, and at least one of the width and the length of the notch groove is 2 mm or more.

6. The semiconductor device according to claim 1, wherein the notch groove joins the inner corner portion of the resin case at a junction, and has a curved portion opposite to the junction, and at least one of a width of the notch groove at the junction and a length from the junction to the curved portion is 2 mm or more, in a plan view.

7. The semiconductor device according to claim 6, wherein the width of the junction is perpendicular to the length from the junction to the curved portion in the plan view.

8. The semiconductor device according to claim 1, wherein the notch groove joins the inner corner portion of the resin case at a junction, an angle between a side defining the inner space of the resin case and a side of the notch groove in a region of the junction, is in a range of 90 degrees to 150 degrees, in a plan view.

9. The semiconductor device according to claim 1, wherein the inner space of the resin case has an approximately rectangular shape in a plan view, the notch groove is provided at each inner corner portion of the resin case, and extends in the stacking direction perpendicular to a surface of the metal substrate.

10. The semiconductor device according to claim 9, wherein the notch groove at said each inner corner portion is provided for reducing the stress caused by a difference between coefficients of thermal expansion of materials of the resin case, the sealant resin and the metal substrate.

11. The semiconductor device according to claim 1, wherein the notch groove at the inner corner portion of the resin case is configured to reduce the stress caused by a difference of coefficients of thermal expansion between materials of the resin case and the metal substrate.

12. The semiconductor device according to claim 1, wherein the metal substrate is fitted into the resin case.

* * * * *